United States Patent
Chow

(10) Patent No.: US 9,084,377 B2
(45) Date of Patent: Jul. 14, 2015

(54) INTEGRATED CIRCUIT PACKAGE SYSTEM WITH MOUNTING FEATURES FOR CLEARANCE

(75) Inventor: Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 95 days.

(21) Appl. No.: 11/694,913

(22) Filed: Mar. 30, 2007

(65) Prior Publication Data

US 2008/0235941 A1 Oct. 2, 2008

(51) Int. Cl.
*H05K 3/34* (2006.01)
*H05K 3/28* (2006.01)
*H05K 1/11* (2006.01)
*H05K 3/12* (2006.01)
*H05K 3/40* (2006.01)

(52) U.S. Cl.
CPC .............. *H05K 3/284* (2013.01); *H05K 1/111* (2013.01); *H05K 3/3442* (2013.01); *H05K 3/3484* (2013.01); *H01L 2224/32225* (2013.01); *H01L 2224/48465* (2013.01); *H01L 2224/49171* (2013.01); *H01L 2224/73265* (2013.01); *H01L 2924/19105* (2013.01); *H05K 3/1216* (2013.01); *H05K 3/3452* (2013.01); *H05K 3/3463* (2013.01); *H05K 3/4007* (2013.01); *H05K 2201/035* (2013.01); *H05K 2201/0367* (2013.01); *H05K 2201/09036* (2013.01); *H05K 2201/09072* (2013.01); *H05K 2201/10636* (2013.01); *H05K 2201/10992* (2013.01); *H05K 2203/043* (2013.01); *H05K 2203/1476* (2013.01); *Y10T 29/49144* (2015.01)

(58) Field of Classification Search
CPC .............. H05K 3/3442; H05K 3/3463; H05K 3301/035; H05K 2201/09036; H05K 2201/0636; H05K 2203/043; H05K 3/1216; H01L 2924/19105; H01L 2224/32225; H01L 2224/4917

USPC ................... 257/E23.141, E21.001, E23.022, 257/E23.116, E23.02, 737, 738, 778

See application file for complete search history.

(56) References Cited

U.S. PATENT DOCUMENTS

| | | | | |
|---|---|---|---|---|
| 3,373,481 | A * | 3/1968 | Lins et al. | 228/175 |
| 3,392,442 | A * | 7/1968 | Napier et al. | 29/840 |
| 5,406,210 | A * | 4/1995 | Pedder | 324/757 |
| 6,271,107 | B1 * | 8/2001 | Massingill et al. | 438/597 |
| 6,521,997 | B1 | 2/2003 | Huang et al. | |
| 6,946,601 | B1 | 9/2005 | Lee et al. | |
| 6,979,636 | B1 | 12/2005 | Lin et al. | |
| 7,109,592 | B2 | 9/2006 | Fortin et al. | |
| 7,145,234 | B2 | 12/2006 | Chang et al. | |
| 8,704,349 | B2 * | 4/2014 | Chow et al. | 257/686 |
| 2001/0035759 | A1 * | 11/2001 | Bernier et al. | 324/755 |
| 2002/0058151 | A1 * | 5/2002 | Uchikoba et al. | 428/621 |
| 2002/0171157 | A1 * | 11/2002 | Soga et al. | 257/783 |
| 2003/0001286 | A1 * | 1/2003 | Kajiwara et al. | 257/778 |
| 2003/0080092 | A1 * | 5/2003 | Arvin et al. | 216/83 |

(Continued)

FOREIGN PATENT DOCUMENTS

JP 6-120226 * 4/1994

*Primary Examiner* — Alexander Oscar Williams

(74) *Attorney, Agent, or Firm* — Ishimaru & Associates LLP

(57) ABSTRACT

An integrated circuit package system is provided including providing a substrate having a contact pad, forming a first conductor having a first melting point over the contact pad, forming a second conductor having a second melting point over the first conductor with the first melting point higher than the second melting point, and mounting a first device over the second conductor.

5 Claims, 15 Drawing Sheets

(56) References Cited

U.S. PATENT DOCUMENTS

| | | | |
|---|---|---|---|
| 2003/0119298 A1* | 6/2003 | Hayashida | 438/612 |
| 2003/0127747 A1* | 7/2003 | Kajiwara et al. | 257/778 |
| 2003/0136813 A1* | 7/2003 | Magerlein et al. | 228/180.5 |
| 2003/0136814 A1* | 7/2003 | Furman et al. | 228/180.21 |
| 2003/0186476 A1* | 10/2003 | Naydenkov et al. | 438/26 |
| 2003/0230806 A1* | 12/2003 | Yamashita et al. | 257/741 |
| 2004/0177997 A1* | 9/2004 | Hata et al. | 174/257 |
| 2004/0238934 A1* | 12/2004 | Warner et al. | 257/686 |
| 2005/0032349 A1* | 2/2005 | Lee et al. | 438/614 |
| 2005/0145412 A1 | 7/2005 | Chi et al. | |
| 2005/0167815 A1 | 8/2005 | Chang et al. | |
| 2005/0173788 A1* | 8/2005 | Cher'Khng et al. | 257/678 |
| 2006/0035412 A1* | 2/2006 | Popescu | 438/119 |
| 2006/0281297 A1* | 12/2006 | Ogawa et al. | 438/622 |
| 2007/0190690 A1* | 8/2007 | Chow et al. | 438/113 |
| 2007/0228543 A1* | 10/2007 | Walter et al. | 257/686 |
| 2007/0245554 A1* | 10/2007 | Salmon | 29/846 |
| 2008/0296761 A1* | 12/2008 | Lee et al. | 257/737 |
| 2009/0035893 A1* | 2/2009 | Nishiyama et al. | 438/121 |
| 2009/0072385 A1* | 3/2009 | Alley et al. | 257/713 |
| 2009/0096092 A1* | 4/2009 | Patel | 257/737 |
| 2009/0152233 A1* | 6/2009 | Cho et al. | 216/13 |
| 2009/0261473 A1* | 10/2009 | Lee et al. | 257/738 |
| 2009/0267213 A1* | 10/2009 | Lin et al. | 257/687 |
| 2010/0109052 A1* | 5/2010 | Nakajima et al. | 257/197 |
| 2013/0306168 A1* | 11/2013 | Braun et al. | 137/544 |

* cited by examiner

INTEGRATED CIRCUIT PACKAGE SYSTEM WITH MOUNTING FEATURES FOR CLEARANCE

TECHNICAL FIELD

The present invention relates generally to integrated circuit package system, and more particularly to integrated circuit package system having multiple devices.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization to increase the density of the components that are packaged therein while decreasing the sizes of the end products having the IC products. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large-scale IC ("LSI") packages that are incorporated into these devices are required to be made smaller and thinner, and the package configurations that house and protect them are required to be made smaller and thinner as well.

Different challenges arise from increased functionality integration and miniaturization. For example, a semiconductor product having increased functionality may be made smaller but may still be required to provide a large number of inputs/outputs (I/O) interface. The size reduction increases the I/O density for the integrated circuit package and its respective integrated circuit carriers.

The ever-increasing I/O density trend presents a myriad of manufacturing problems. Some of these problems reside integrated circuit manufacturing realm. Others problems involve mounting these increase I/O density integrated circuits on carriers for packaging. As I/O density increases, contact structures or pads on the carriers also increase in density.

Passive devices, such as surface mount resistors, capacitors, or inductors, provide simplified illustrations of the problems arising from increased I/O density. A passive device typically has two terminals and the ever-decreasing space between these terminals may be extrapolated to a higher numbers of I/Os found in integrated circuit devices. As more functionality is packed into integrated circuit packages, passive devices may also be packed into the same package.

As passive devices having reduced space between terminals, reduced terminal space and pad densities pose cleaning problems. The height and distance between the pads and terminals restrict the flow of cleaning solutions between terminals potentially leaving behind debris. Molding the passive devices having reduced terminal spacing in an integrated circuit package may leave voids between the terminals. Electrical shorts may also result from solder bridging between adjacent terminals or pads. These problems and others reduce manufacturing yields, degrade reliability, and increase cost.

Thus, a need still remains for an integrated circuit package system providing low cost manufacturing and improved yield for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including providing a substrate having a contact pad, forming a first conductor having a first melting point over the contact pad, forming a second conductor having a second melting point over the first conductor with the first melting point higher than the second melting point, and mounting a first device over the second conductor.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
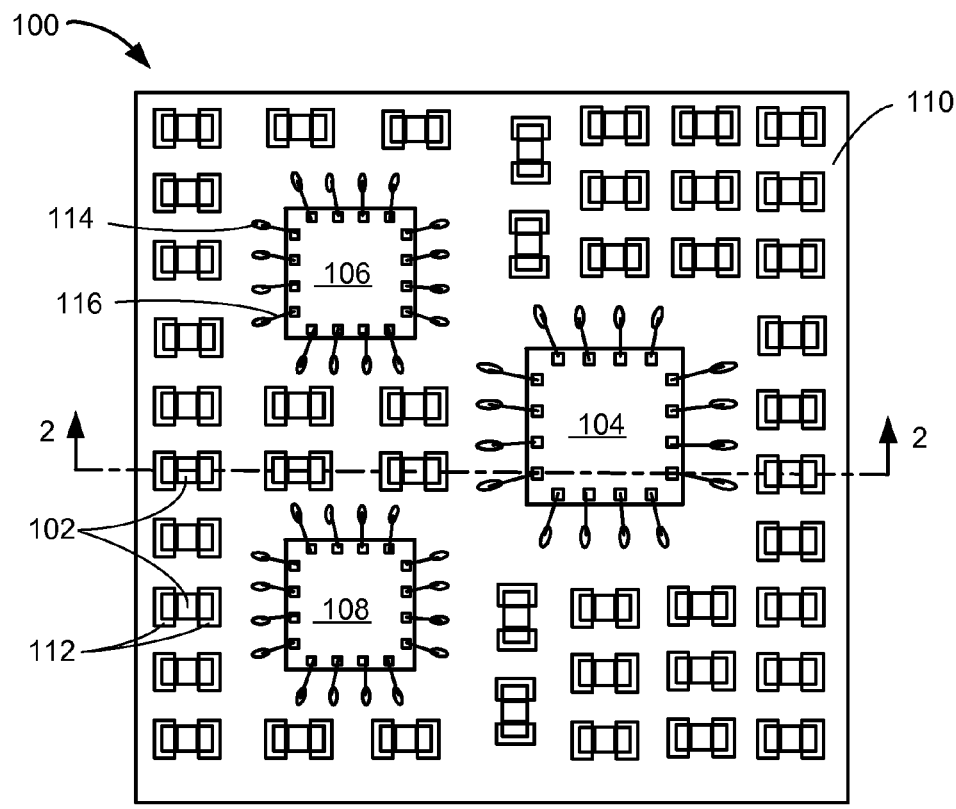
FIG. 1 is a plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a plan view of an integrated circuit package system 100 in an embodiment of the present invention. The plan view depicts the integrated circuit package system 100 without a cover.

The plan view depicts the integrated circuit package system 100 as a system-in-package (SiP) system. As an example, the integrated circuit package system 100 includes first devices 102, a second device 104, and a third device 106, and a fourth device 108 over a substrate 110, such as a silicon substrate, a ceramic substrate, or a printed circuit board substrate.

The first devices 102 may be a number of different devices. For example, the first devices 102 can be selected from resistors, capacitors, inductors, or other discrete components. The first devices 102 are surface mount devices. For illustrative purposes, the first devices 102 are shown substantially the same, although it is understood that the first devices 102 may differ from each other. The first devices 102 connect with contact pads 112 in the substrate 110. The second device 104, the third device 106, and the fourth device 108 connect to bond pads 114 in the substrate 110, adjacent to the contact pads 112, with interconnects 116, such as bond wires.

For illustrative purposes, the second device 104, the third device 106, and the fourth device 108 are as shown as integrated circuit dice, although it is understood that the second device 104, the third device 106, and the fourth device 108 may not all be integrated circuit dice, such as packaged devices. Also for illustrative purposes, the second device 104, the third device 106, and the fourth device 108 are shown as wire bonded integrated circuit dice, although it is understood that the second device 104, the third device 106, and the fourth device 108 may not all be wire bonded integrated circuit dice, such as flip chip.

Figure 2:
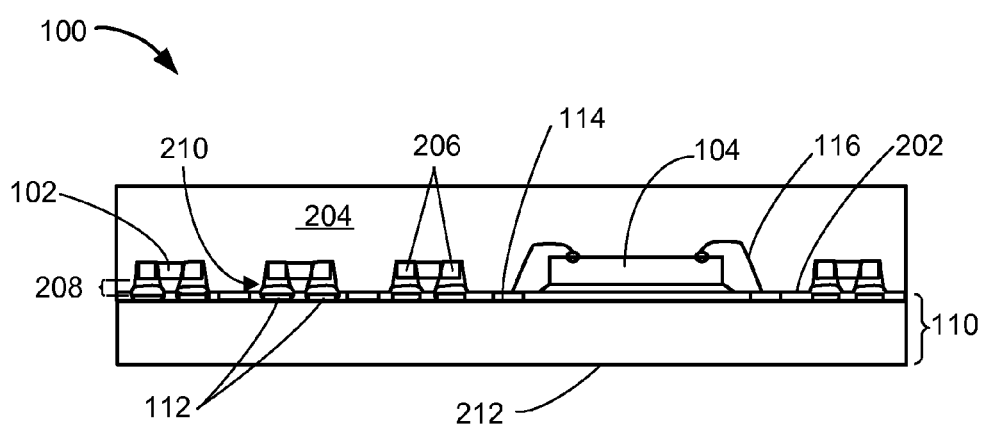
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the first devices 102 and the second device 104 over a first surface 202 of the substrate 110. An encapsulation 204, such as an epoxy mold compound, covers the first devices 102, the second device 104, the third device 106, and the fourth device 108 over the first surface 202.

As consumers demand increased functionality, miniaturization, or a combination thereof, the input/output (I/O) density for the integrated circuit package system 100 has also increased. For brevity and simplicity, the first devices 102, such as passive components, are embodiment examples of the present invention but it is understood that the invention may preferably be applied to other complex devices, such as integrated circuit die, packaged integrated circuit devices (not shown) within the integrated circuit package system 100, or the integrated circuit package system 100.

Typically, the first devices 102 include a pair of terminals 206, such as electrical terminals or I/O. A clearance 208, also referred to as standoff height, is the space between each of the first devices 102 and the substrate 110. As the integrated circuit package system 100 continues to shrink in size, the clearance 208 also decreases and creating numerous problems, such as inadequate cleaning and voids in the encapsulation 204, below the first devices 102.

Connection structures 210 serve multiple functions. For example, the connection structures 210 provide electrical and mechanical connection between the first devices 102 and the contact pads 112. Also, the connection structures 210 provide the clearance to mitigate or eliminate some of problems associated with miniaturization, such as inadequate cleaning, voids in the encapsulation 204, and inadvertent bridging between the terminals 206. The connection structures 210 will be described in more detail later.

The interconnects 116 connect the second device 104 and the bond pads 114. The encapsulation 204 also covers the connection structures 210 and the interconnects 116 over the first surface 202. A second surface 212 of the substrate 110, opposite the first surface 202, may include other connectivity structures (not shown), such as an array of lands, an array of solder balls, for connecting to the next system level (not shown), such as a printed circuit board or another integrated circuit package system.

Figure 3:
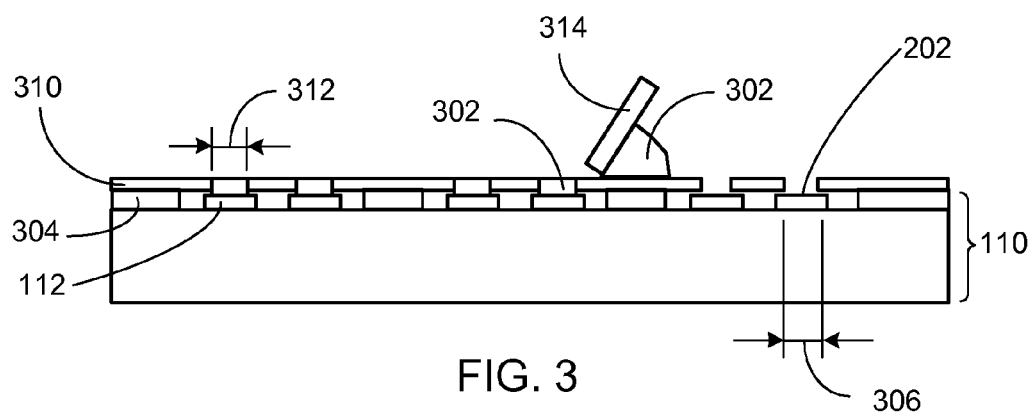
FIG. 3 is a cross-sectional view of the substrate of FIG. 2 in applying a first conductive material in a first embodiment of the present invention.

Referring now to FIG. 3, therein is shown a cross-sectional view of the substrate 110 of FIG. 2 in applying a first conductive material 302. The cross-sectional view depicts a solder mask 304 having mask openings 306 for exposing the contact pads 112. The solder mask 304 is part of the substrate 110 providing the first surface 202.

A first mask 310, such as a screen print or stencil, is placed over the solder mask 304. The first mask 310 has first openings 312 over the contact pads 112. The first conductive material 302, such as solder paste, is applied over the first mask 310 and fills the first openings 312. The first conductive material 302 preferably contacts the contact pads 112.

The first conductive material 302 may be applied in a number of different ways. For example, an application device 314, such as a squeegee, may be moved along the exposed surface of the first mask 310. The movement of the application device 314 spreads the first conductive material 302 along the exposed surface of the first mask 310 filling the first openings 312.

Figure 4:
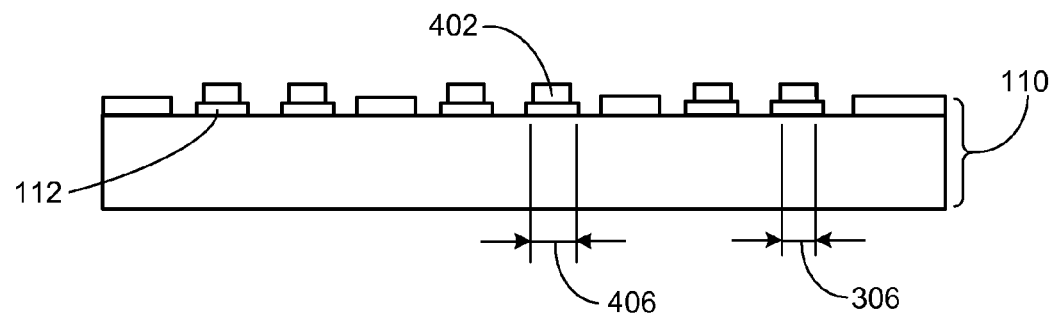
FIG. 4 is the structure of FIG. 3 in forming first conductive structures.

Referring now to FIG. 4, therein is shown the structure of FIG. 3 in forming first conductive structures 402. The first mask 310 of FIG. 3 has been removed leaving the first conductive structures 402 over the contact pads 112. The first conductive structures 402 are formed from the first openings 312 of FIG. 3 and are within the mask openings 306 of the substrate 110. The contact pads 112 have a contact width 406. The first conductive structures 402 are preferably aligned within the boundary of the contact pads 112. The first conductive structures 402 are shown in a column configuration.

Figure 5:
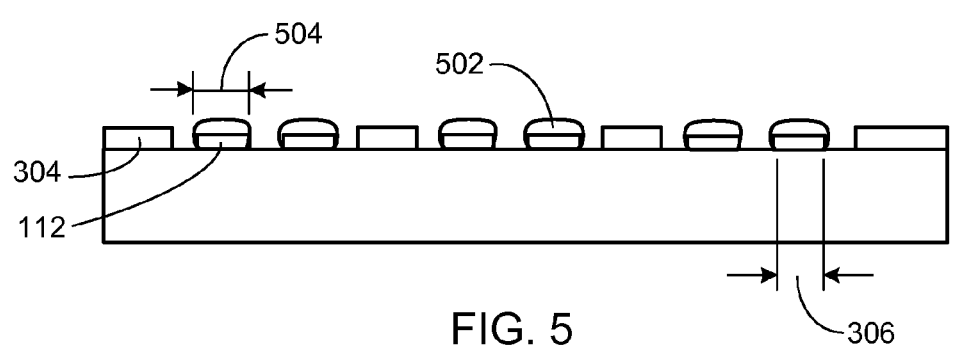
FIG. 5 is the structure of FIG. 4 in forming first conductors.

Referring now to FIG. 5, therein is shown the structure of FIG. 4 in forming first conductors 502. The first conductive structures 402 of FIG. 4 undergo a reflow or melting process whereby the first conductive structures 402 are transformed to the first conductors 502 over the contact pads 112. The first conductors 502 are preferably with the mask openings 306 without contacting the adjacent instance of the first conductors 502. The first conductors 502 have a first width 504 and do not overhang the solder mask 304.

Figure 6:
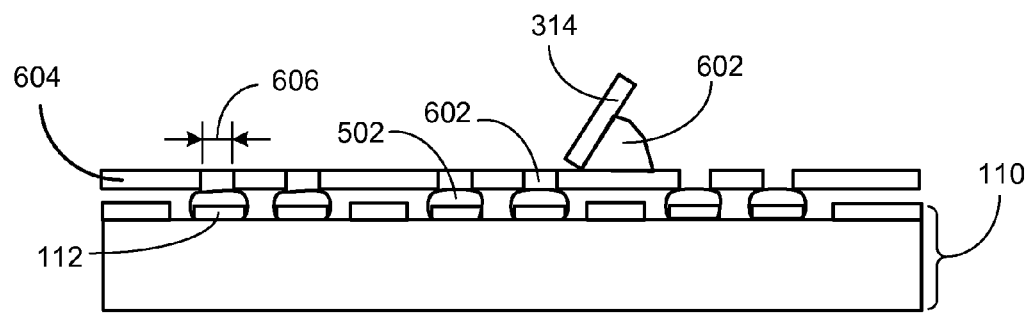
FIG. 6 is the structure of FIG. 5 in applying a second conductive material.

Referring now to FIG. 6, therein is shown the structure of FIG. 5 in applying a second conductive material 602. A second mask 604, such as a screen print or stencil, is placed over the first conductors 502, the contact pads 112, and the substrate 110. The second mask 604 has second openings 606 over the first conductors 502 and the contact pads 112. The second conductive material 602, such as solder paste, is applied over the second mask 604 and fills the second openings 606. The second conductive material 602 preferably contacts the first conductors 502.

The second conductive material 602 may be applied in a number of different ways. For example, the application device 314, such as a squeegee, may be moved along the exposed surface of the second mask 604. The movement of the application device 314 spreads the second conductive material 602 along the exposed surface of the second mask 604 filling the second openings 606.

Figure 7:
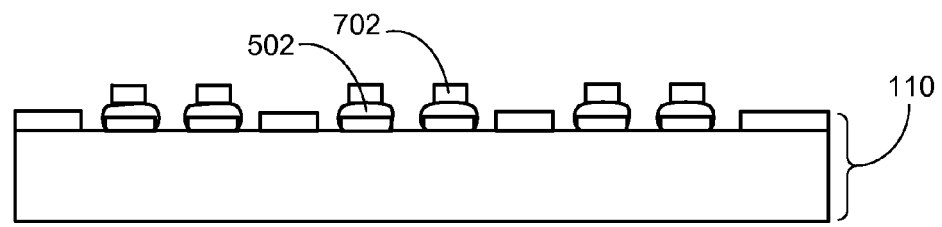
FIG. 7 is the structure of FIG. 6 in forming second conductive structures.

Referring now to FIG. 7, therein is shown the structure of FIG. 6 in forming second conductive structures 702. The second mask 604 of FIG. 6 has been removed leaving the second conductive structures 702 over the first conductors 502. The second conductive structures 702 are formed from the second openings 606 of FIG. 6 and are over the substrate 110. The second conductive structures 702 are preferably aligned within the boundary of the first conductors 502. The second conductive structures 702 are shown in a column configuration.

Figure 8:
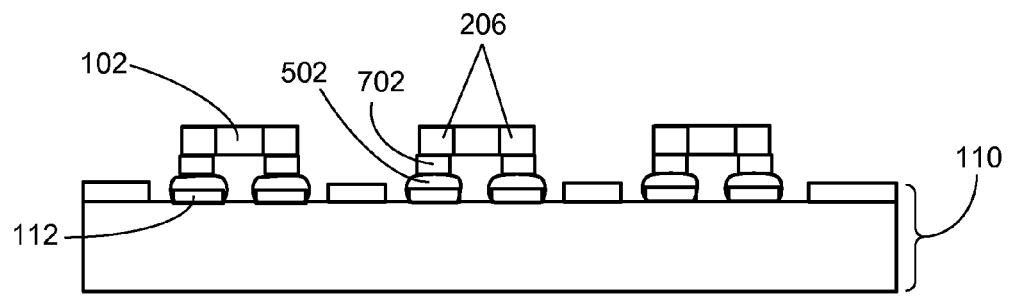
FIG. 8 is the structure of FIG. 7 in mounting the first devices.

Referring now to FIG. 8, therein is shown the structure of FIG. 7 in mounting the first devices 102. The first devices 102 are placed over the substrate 110 with the terminals 206 over the second conductive structures 702. The second conductive structures 702 are over the first conductors 502 which are over the contact pads 112.

Figure 9:
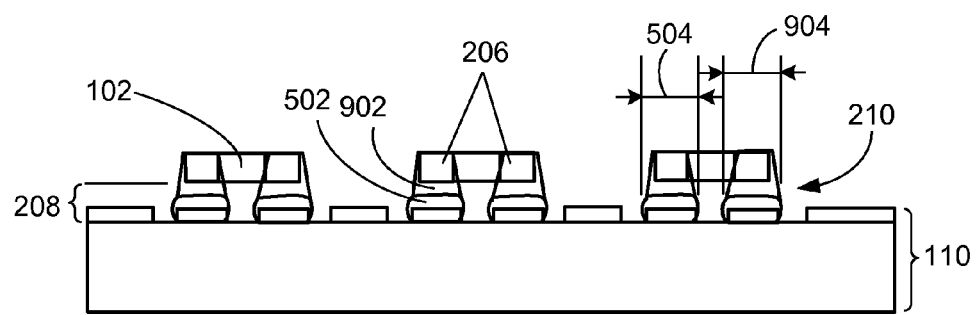
FIG. 9 is the structure of FIG. 8 in forming second conductors.

Referring now to FIG. 9, therein is shown the structure of FIG. 8 in forming second conductors 902. The second conductive structures 702 of FIG. 8 undergo a reflow or melting process whereby the second conductive structures 702 are transformed to the second conductors 902 over the first conductors 502. The second conductors 902 may overhang the first conductors 502 without contacting the adjacent instance of the second conductors 902 or the adjacent instance of the first conductors 502. The second conductors 902 have a second width 904, wherein the second width 904 is less than or equal to the first width 504. The second conductors 902 form mechanical and electrical connections with the terminals 206 of the first devices 102. The first conductors 502 and the second conductors 902 form the connection structures 210.

The first conductors 502 have a higher melting point than the second conductive structures 702 such that the first conductors 502 do not melt as the second conductive structures 702 undergo reflow. The avoidance of the first conductors 502 melting with the second conductive structures 702 mitigate and eliminates shorting the first conductors 502 with the adjacent instance of the first conductors 502 or with the adjacent instance of the second conductors 902. Also, avoiding another reflow of the first conductors 502 does not reduce the clearance 208 or the space between the first devices 102 and the substrate 110.

An example composition of the first conductors 502 includes tin (Sn), silver (Ag), and copper (Cu), such as SnAg3.0Cu0.5, having the first melting point about the range of 215° C. to 220° C. An example composition of the second conductors 902 includes tin (Sn), bismuth (Bi), and silver (Ag), such as SnBi57Ag1, having the second melting point about the range of 135° C. to 140° C.

Figure 10:
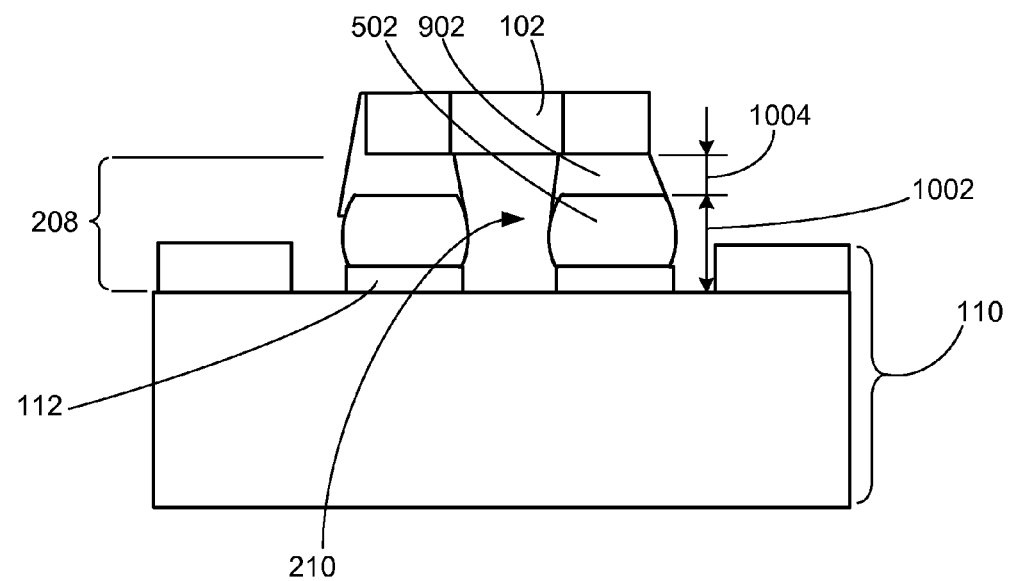
FIG. 10 is a more detailed cross-sectional view of a portion of the structure of FIG. 9.

Referring now to FIG. 10, therein is shown a more detailed cross-sectional view of a portion of the structure of FIG. 9. The more detailed cross-sectional view depicts one of the first devices 102 connected with the connection structures 210 and over the substrate 110.

The first conductors 502 have a first height 1002 above the substrate 110 within the mask openings 306. The first conductors 502 are over the contact pads 112. The second conductors 902 have a second height 1004 above the first conductors 502. The clearance 208 of the first conductors 502 above the substrate 110 is the combination of the first height 1002 and the second height 1004. The clearance 208 provides space for the reliability cleaning process and mold flow for forming the encapsulation 204 of FIG. 2.

Figure 11:
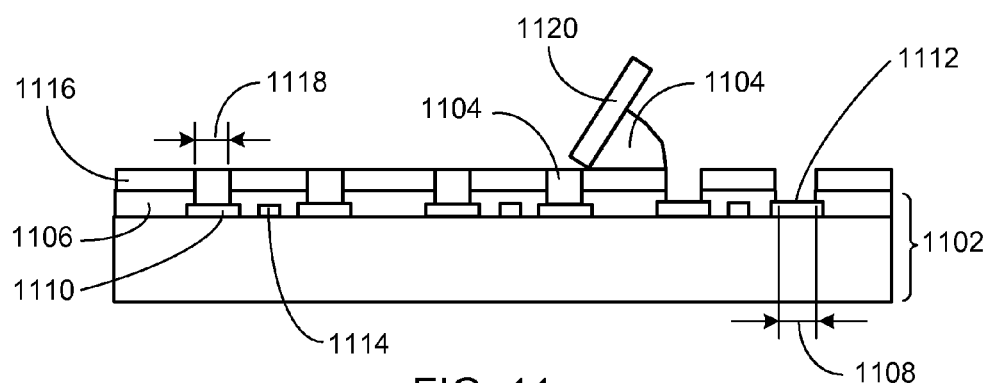
FIG. 11 is a cross-sectional view of a substrate in applying a first conductive material in a second embodiment of the present invention.

Referring now to FIG. 11, therein is shown a cross-sectional view of a substrate 1102 in applying a first conductive material 1104 in a second embodiment of the present invention. The cross-sectional view depicts a solder mask 1106 having mask openings 1108 for exposing contact pads 1110. The solder mask 1106 is part of the substrate 1102 providing a first surface 1112. A conductive line 1114, such as a routing trace, is shown between pairs of the contact pads 1110 and in the substrate 1102. The conductive line 1114 is preferably not exposed and within the substrate 1102.

A first mask 1116, such as a screen print or stencil, is placed over the solder mask 1106. The first mask 1116 has first openings 1118 over the contact pads 1110. The first conductive material 1104, such as solder paste, is applied over the first mask 1116 and fills the first openings 1118. The first conductive material 1104 preferably contacts the contact pads 1110.

The first conductive material 1104 may be applied in a number of different ways. For example, an application device 1120, such as a squeegee, may be moved along the exposed surface of the first mask 1116. The movement of the application device 1120 spreads the first conductive material 1104 along the exposed surface of the first mask 1116 filling the first openings 1118.

Figure 12:
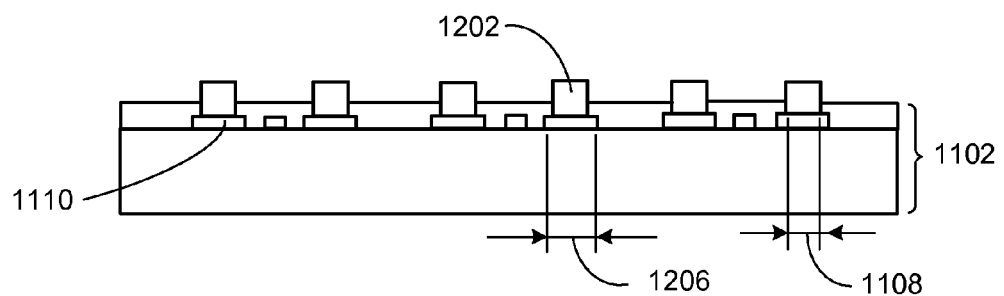
FIG. 12 is the structure of FIG. 11 in forming first conductive structures.

Referring now to FIG. 12, therein is shown the structure of FIG. 11 in forming first conductive structures 1202. The first mask 1116 of FIG. 11 has been removed leaving the first conductive structures 1202 over the contact pads 1110. The first conductive structures 1202 are formed from the first openings 1118 of FIG. 11 and are within the mask openings 1108 of the substrate 1102. The contact pads 1110 have a contact width 1206. The first conductive structures 1202 are preferably aligned within the boundary of the contact pads 1110. The first conductive structures 1202 are shown in a column configuration.

Figure 13:
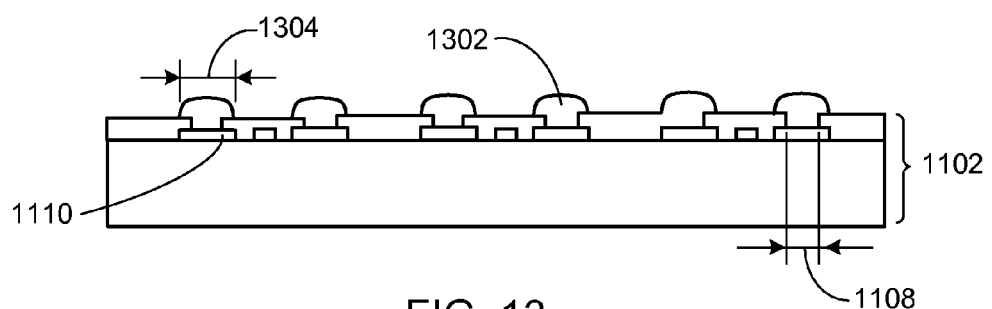
FIG. 13 is the structure of FIG. 12 in forming first conductors.

Referring now to FIG. 13, therein is shown the structure of FIG. 12 in forming first conductors 1302. The first conductive structures 1202 of FIG. 12 over the substrate 1102 undergo a reflow or melting process whereby the first conductive structures 1202 are transformed to the first conductors 1302 over the contact pads 1110. The first conductors 1302 may overhang the mask openings 1108 without contacting the adjacent instance of the first conductors 1302. The first conductors 1302 have a first width 1304.

Figure 14:
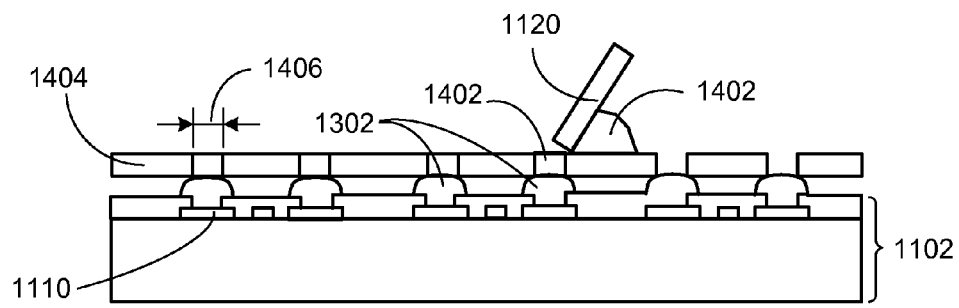
FIG. 14 is the structure of FIG. 13 in applying a second conductive material.

Referring now to FIG. 14, therein is shown the structure of FIG. 13 in applying a second conductive material 1402. A second mask 1404, such as a screen print or stencil, is placed over the first conductors 1302, the contact pads 1110, and the substrate 1102. The second mask 1404 has second openings 1406 over the first conductors 1302 and the contact pads 1110. The second conductive material 1402, such as solder paste, is applied over the second mask 1404 and fills the second openings 1406. The second conductive material 1402 preferably contacts the first conductors 1302.

The second conductive material 1402 may be applied in a number of different ways. For example, the application device 1120, such as a squeegee, may be moved along the exposed surface of the second mask 1404. The movement of the application device 1120 spreads the second conductive material 1402 along the exposed surface of the second mask 1404 filling the second openings 1406.

Figure 15:
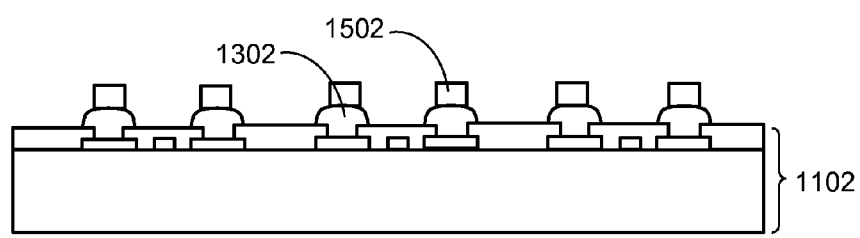
FIG. 15 is the structure of FIG. 14 in forming second conductive structures.

Referring now to FIG. 15, therein is shown the structure of FIG. 14 in forming second conductive structures 1502. The second mask 1404 of FIG. 14 has been removed leaving the second conductive structures 1502 over the first conductors 1302. The second conductive structures 1502 are formed from the second openings 1406 of FIG. 14 and are over the substrate 1102. The second conductive structures 1502 are preferably aligned within the boundary of the first conductors 1302. The second conductive structures 1502 are shown in a column configuration.

Figure 16:
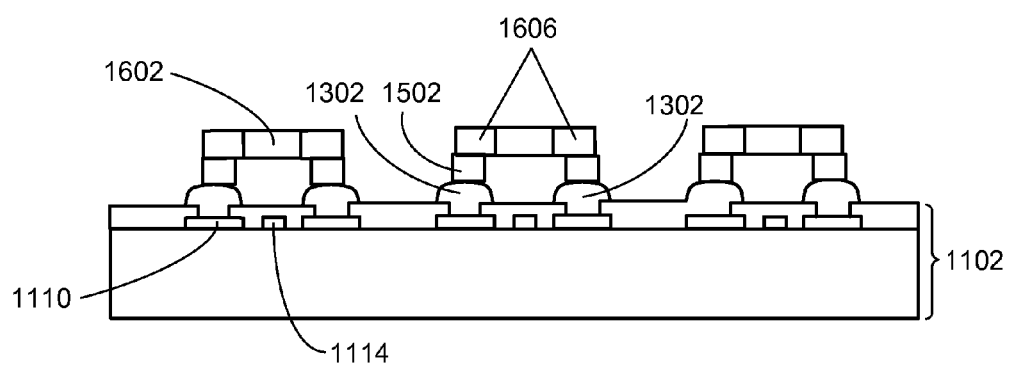
FIG. 16 is the structure of FIG. 15 in mounting the first devices.

Referring now to FIG. 16, therein is shown the structure of FIG. 15 in mounting first devices 1602. The first devices 1602 are placed over the substrate 1102 with terminals 1606 over the second conductive structures 1502. The second conductive structures 1502 are over the first conductors 1302 which are over the contact pads 1110. The conductive line 1114 is between the pairs of the terminals 1606 for each of the first devices 1602 and within the substrate 1102.

Figure 17:
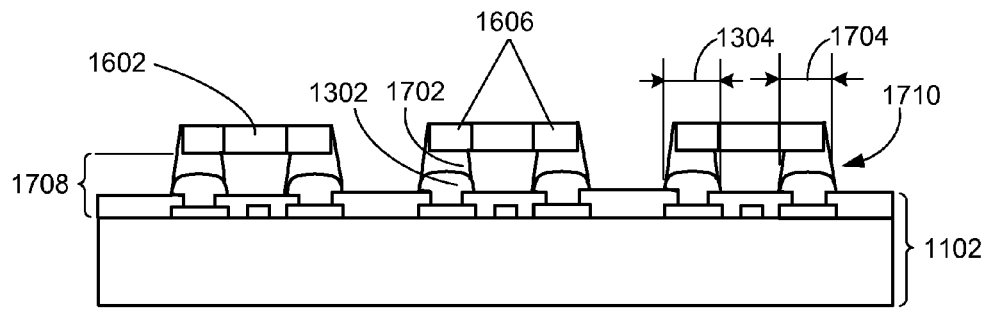
FIG. 17 is the structure of FIG. 16 in forming second conductors.

Referring now to FIG. 17, therein is shown the structure of FIG. 16 in forming second conductors 1702. The second conductive structures 1502 of FIG. 16 undergo a reflow or melting process whereby the second conductive structures 1502 are transformed to the second conductors 1702 over the first conductors 1302. The second conductors 1702 may overhang the first conductors 1302 without contacting the adjacent instance of the second conductors 1702 or the adjacent instance of the first conductors 1302. The second conductors 1702 have a second width 1704, wherein the second width 1704 is less than or equal to the first width 1304. The second conductors 1702 form mechanical and electrical connections with the terminals 1606 of the first devices 1602. The first conductors 1302 and the second conductors 1702 form connection structures 1710.

The first conductors 1302 have a higher melting point than the second conductive structures 1502 such that the first conductors 1302 do not melt as the second conductive structures 1502 undergo reflow. The avoidance of the first conductors 1302 melting with the second conductive structures 1502 mitigate and eliminates shorting the first conductors 1302 with the adjacent instance of the first conductors 1302 or with the adjacent instance of the second conductors 1702. Also, avoiding another reflow of the first conductors 1302 does not reduce a clearance 1708 or the space between the first devices 1602 and the substrate 1102.

An example composition of the first conductors 1302 includes tin (Sn), silver (Ag), and copper (Cu), such as SnAg3.0Cu0.5, having the first melting point about the range of 215° C. to 220° C. An example composition of the second conductors 1702 includes tin (Sn), bismuth (Bi), and silver (Ag), such as SnBi57Ag1, having the second melting point about the range of 135° C. to 140° C.

Figure 18:
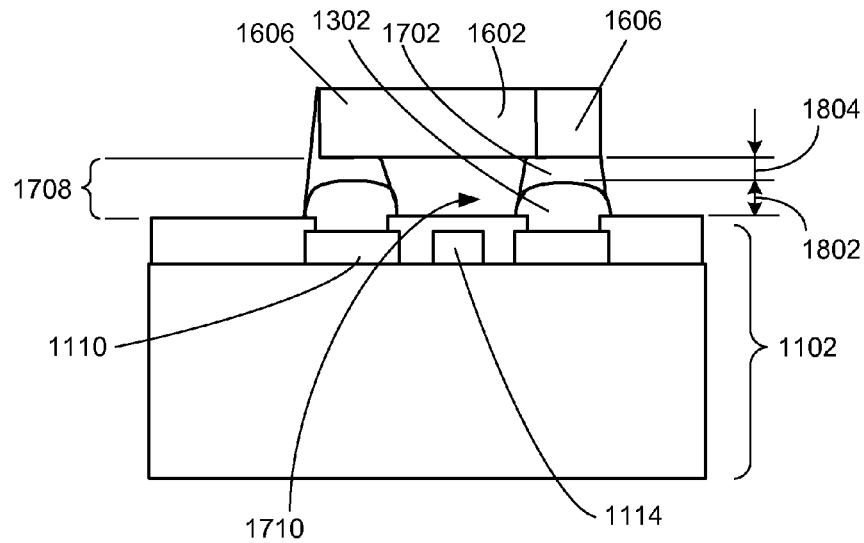
FIG. 18 is a more detailed cross-sectional view of a portion of the structure of FIG. 17.

Referring now to FIG. 18, therein is shown a more detailed cross-sectional view of a portion of the structure of FIG. 17. The more detailed cross-sectional view depicts one of the first devices 1602 connected with the connection structures 1710 and over the substrate 1102. The conductive line 1114 is between the pair of the contact pads 1110 connected to the pair of the terminals 1606.

The first conductors 1302 have a first height 1802 above the substrate 1102. The second conductors 1702 have a second height 1804 above the first conductors 1302. The clearance 1708 of the first conductors 1302 above the substrate 1102 is the combination of the first height 1802 and the second height 1804. The clearance 1708 provides space for the reliability cleaning process and mold flow for forming the encapsulation 204 of FIG. 2.

Figure 19:
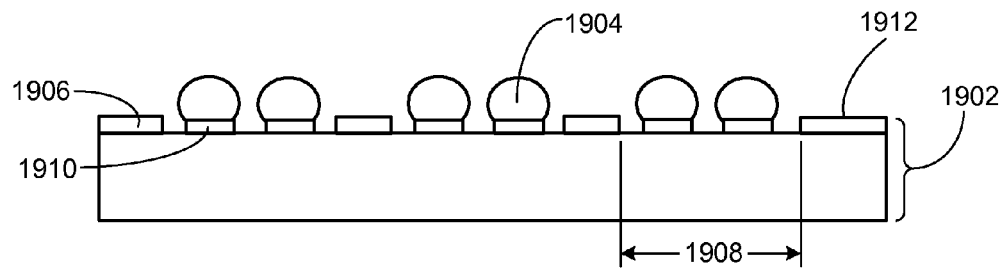
FIG. 19 is a cross-sectional view of a substrate in attaching first conductive structures in a third embodiment of the present invention.

Referring now to FIG. 19, therein is shown a cross-sectional view of a substrate 1902 in attaching first conductive structures 1904 in an alternative embodiment of the present invention. The substrate 1902 may represent the substrate 110 of FIG. 1 of the integrated circuit package system 100 of FIG. 1.

The cross-sectional view depicts a solder mask 1906 having mask openings 1908 for exposing contact pads 1910. The solder mask 1906 is part of the substrate 1902 providing a first surface 1912 of the substrate 1902. Each of the mask openings 1908 is shown exposing a pair of the contact pads 1910. The first conductive structures 1904, such as solder balls, gold balls, or stud bumps, are attached over the contact pads 1910.

Figure 20:
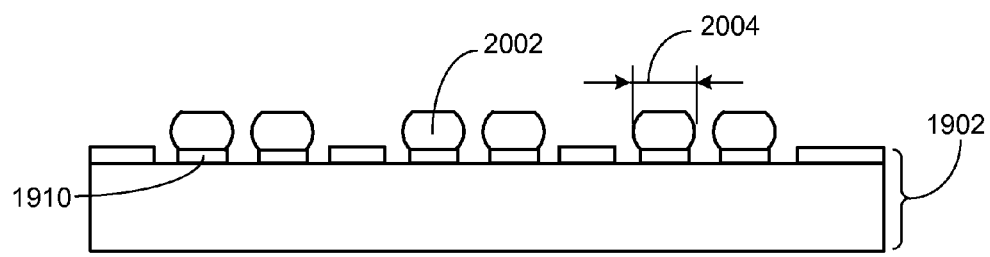
FIG. 20 is the structure of FIG. 19 in forming first conductors.

Referring now to FIG. 20, therein is shown the structure of FIG. 19 in forming first conductors 2002. The first conductive structures 1904 of FIG. 19 undergoes a partial planarization process, such as coining, forming the first conductors 2002. The first conductors 2002 have a first width 2004 and are over the substrate 1902.

The first conductive structures 1904 may represent the first conductors 2002 if the first conductive structures 1904 are planarized prior to attaching to the contact pads 1910 or if the first conductive structures 1904 are tailed, such as tailed gold bumps. This step may be optional in that case.

Figure 21:
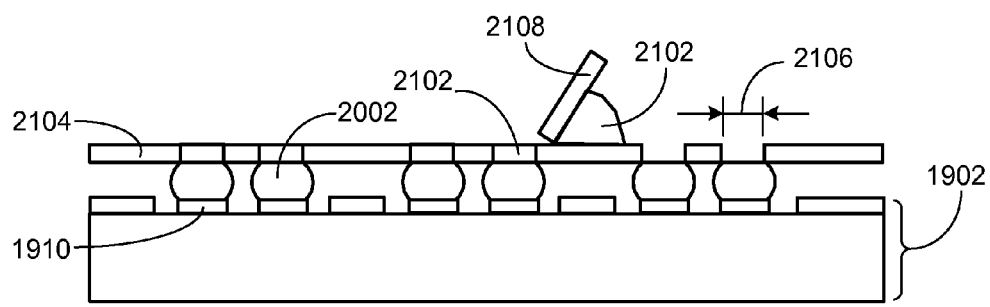
FIG. 21 is the structure of FIG. 20 in applying a conductive material.

Referring now to FIG. 21, therein is shown the structure of FIG. 20 in applying a conductive material 2102. A mask 2104, such as a screen print or stencil, is placed over the first conductors 2002, the contact pads 1910, and the substrate 1902. The mask 2104 has openings 2106 over the first conductors 2002 and the contact pads 1910. The conductive material 2102, such as solder paste, is applied over the mask 2104 and fills the openings 2106. The conductive material 2102 preferably contacts the first conductors 2002.

The conductive material 2102 may be applied in a number of different ways. For example, an application device 2108, such as a squeegee, may be moved along the exposed surface of the mask 2104. The movement of the application device 2108 spreads the conductive material 2102 along the exposed surface of the mask 2104 filling the openings 2106.

Figure 22:
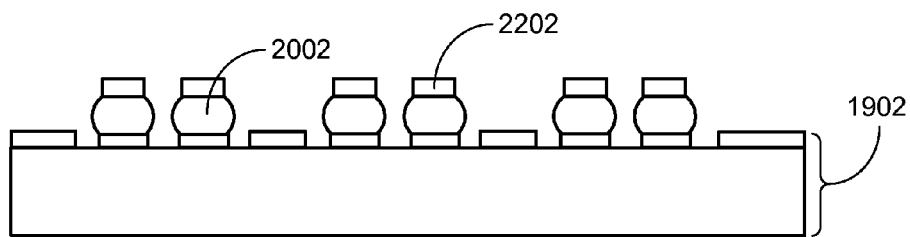
FIG. 22 is the structure of FIG. 21 in forming second conductive structures.

Referring now to FIG. 22, therein is shown the structure of FIG. 21 in forming second conductive structures 2202. The mask 2104 of FIG. 21 has been removed leaving the second conductive structures 2202 over the first conductors 2002. The second conductive structures 2202 are formed from the openings 2106 of FIG. 21 and are over the substrate 1902. The second conductive structures 2202 are preferably aligned within the boundary of the first conductors 2002. The second conductive structures 2202 are shown in a column configuration.

Figure 23:
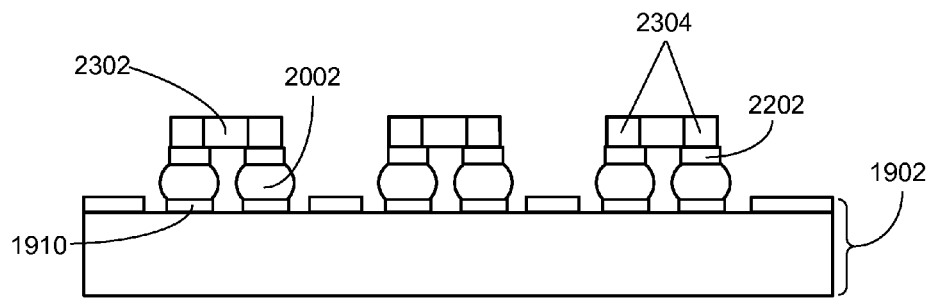
FIG. 23 is the structure of FIG. 22 in mounting the first devices.

Referring now to FIG. 23, therein is shown the structure of FIG. 22 in mounting first devices 2302. The first devices 2302 are placed over the substrate 1902 with terminals 2304 over the second conductive structures 2202. The second conductive structures 2202 are over the first conductors 2002 which are over the contact pads 1910.

Figure 24:
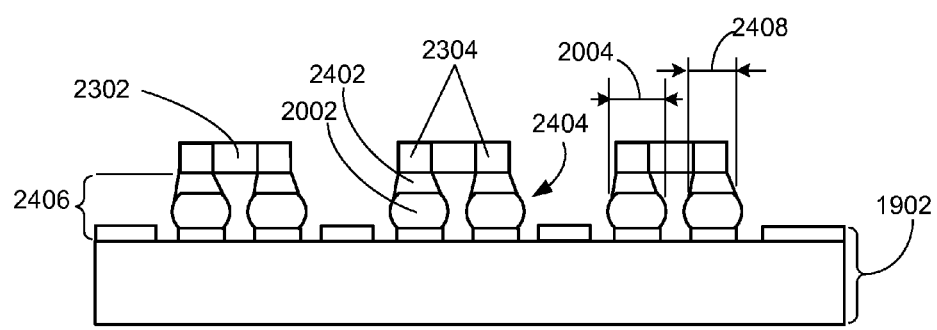
FIG. 24 is the structure of FIG. 23 in forming second conductors.

Referring now to FIG. 24, therein is shown the structure of FIG. 23 in forming second conductors 2402. The second conductive structures 2202 of FIG. 23 undergo a reflow or melting process whereby the second conductive structures 2202 are transformed to the second conductors 2402 over the first conductors 2002. The second conductors 2402 may overhang the first conductors 2002 without contacting the adjacent instance of the second conductors 2402 or the adjacent instance of the first conductors 2002. The second conductors 2402 form mechanical and electrical connections with the terminals 2304 of the first devices 2302. The first conductors 2002 and the second conductors 2402 form connection structures 2404.

The first conductors 2002 have a higher melting point than the second conductive structures 2202 such that the first conductors 2002 do not melt as the second conductive structures 2202 undergo reflow. The avoidance of the first conductors 2002 melting with the second conductive structures 2202 mitigates and eliminates shorting the first conductors 2002 with the adjacent instance of the first conductors 2002 or with the adjacent instance of the second conductors 2402. Also, avoiding another reflow of the first conductors 2002 does not reduce a clearance 2406 or the space between the first devices 2302 and the substrate 1902. The second conductors 2402 have a second width 2408, wherein the second width 2408 is less than or equal to the first width 2004.

Figure 25:
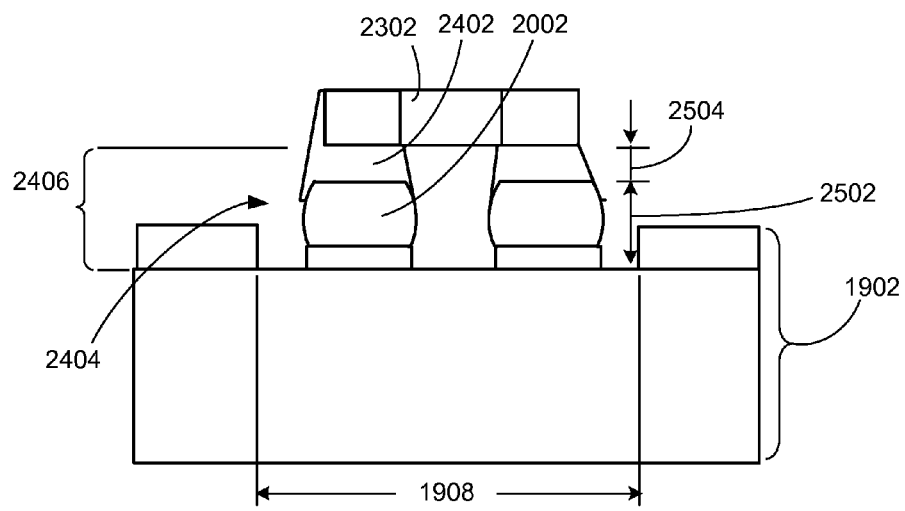
FIG. 25 is a more detailed cross-sectional view of a portion of the structure of FIG. 24.

Referring now to FIG. 25, therein is shown a more detailed cross-sectional view of a portion of the structure of FIG. 24. The more detailed cross-sectional view depicts one of the first devices 2302 connected with the connection structures 2404 and over the substrate 1902.

The first conductors 2002 have a first height 2502 above the substrate 1902 within the mask openings 1908. The second conductors 2402 have a second height 2504 above the first conductors 2002. The clearance 2406 of the first conductors 2002 above the substrate 1902 is the combination of the first height 2502 and the second height 2504. The clearance 2406 provides space for the reliability cleaning process and mold flow for forming the encapsulation 204 of FIG. 2.

Figure 26:
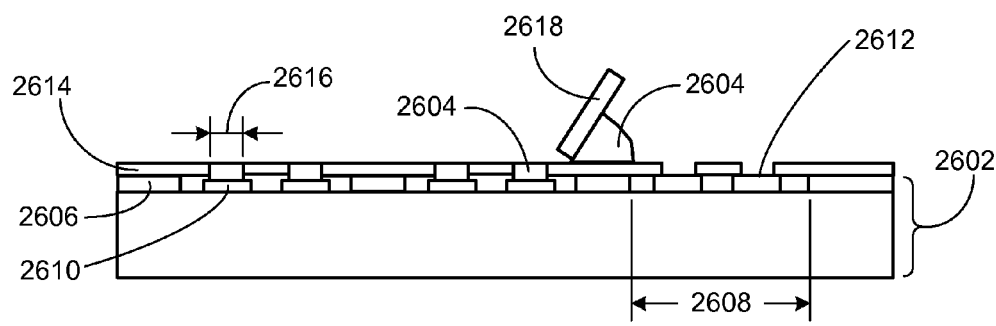
FIG. 26 is a cross-sectional view of a substrate in applying a first conductive material in a fourth embodiment of the present invention.

Referring now to FIG. 26, therein is shown a cross-sectional view of a substrate 2602 in applying a first conductive material 2604 in another alternative embodiment of the present invention. The substrate 2602 may represent the substrate 110 of FIG. 1 of the integrated circuit package system 100 of FIG. 1.

The cross-sectional view depicts a solder mask 2606 having mask openings 2608 for exposing contact pads 2610. The solder mask 2606 is part of the substrate 2602 providing a first surface 2612 of the substrate 2602.

A first mask 2614, such as a screen print or stencil, is placed over the solder mask 2606. The first mask 2614 has first openings 2616 over the contact pads 2610. The first conductive material 2604, such as solder paste, is applied over the first mask 2614 and fills the first openings 2616. The first conductive material 2604 preferably contacts the contact pads 2610.

The first conductive material 2604 may be applied in a number of different ways. For example, an application device 2618, such as a squeegee, may be moved along the exposed surface of the first mask 2614. The movement of the application device 2618 spreads the first conductive material 2604 along the exposed surface of the first mask 2614 filling the first openings 2616.

Figure 27:
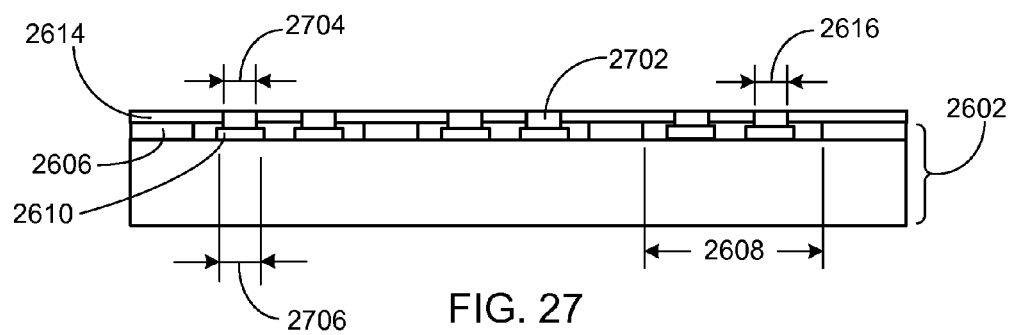
FIG. 27 is the structure of FIG. 26 in forming first conductors.

Referring now to FIG. 27, therein is shown the structure of FIG. 26 in forming first conductors 2702. The first mask 2614 remains over the solder mask 2606 and have the first conductive material 2604 of FIG. 26 in the first openings 2616 over the contact pads 2610. The first conductive material 2604 undergo a reflow or melting process whereby the first conductive material 2604 are transformed to the first conductors 2702 over the contact pads 2610. The first conductors 2702 have a first width 2704 and are within the mask openings 2608 of the substrate 2602. The contact pads 2610 have a contact width 2706 that is greater than the first width 2704 such that the first conductors 2702 are preferably aligned within the boundary of the contact pads 2610. The first conductors 2702 are shown in a column configuration.

The first mask 2614 has a similar or substantially the same coefficient of thermal expansion (CTE) as the substrate 2602. This CTE similarity mitigates or prevents thermal stress from warpage during reflow.

Figure 28:
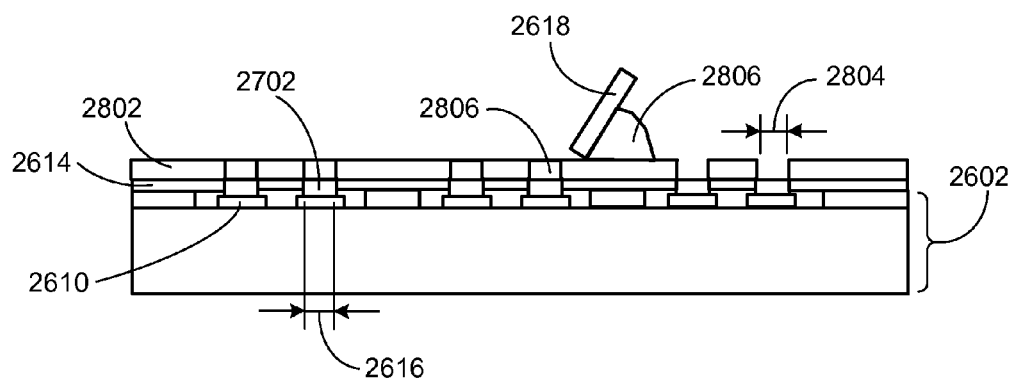
FIG. 28 is the structure of FIG. 27 in applying a second conductive material.

Referring now to FIG. 28, therein is shown the structure of FIG. 27 in applying a second conductive material. A second mask 2802, such as a screen print or stencil, is placed over the first mask 2614, the first conductors 2702, the contact pads 2610, and the substrate 2602. The second mask 2802 has second openings 2804 over the first openings 2616, the first conductors 2702 and the contact pads 2610. Second conductive material 2806, such as solder paste, are applied over the second mask 2802 and fill the second openings 2804. The second conductive material 2806 preferably contacts the first conductors 2702.

The second conductive material 2806 may be applied in a number of different ways. For example, the application device 2618, such as a squeegee, may be moved along the exposed surface of the second mask 2802. The movement of the application device 2618 spreads the second conductive material 2806 along the exposed surface of the second mask 2802 filling the second openings 2804.

Figure 29:
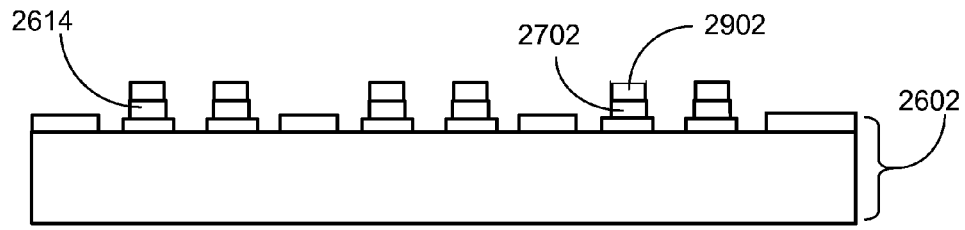
FIG. 29 is the structure of FIG. 28 in forming second conductive structures.

Referring now to FIG. 29, therein is shown the structure of FIG. 28 in forming second conductive structures 2902. The first mask 2614 and the second mask 2802 of FIG. 28 have been removed leaving the second conductive structures 2902 over the first conductors 2702. The second conductive structures 2902 are formed from the second openings 2804 of FIG. 28 and are over the substrate 2602. The second conductive structures 2902 are preferably aligned within the boundary of the first conductors 2702. The second conductive structures 2902 are shown in a column configuration.

Figure 30:
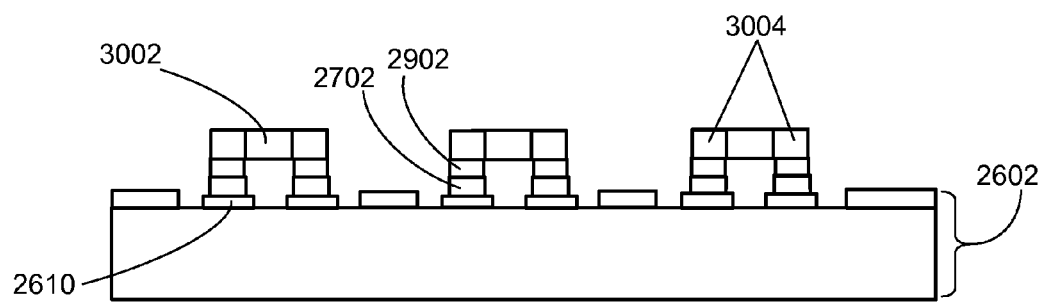
FIG. 30 is the structure of FIG. 29 in mounting the first devices.

Referring now to FIG. 30, therein is shown the structure of FIG. 29 in mounting first devices 3002. The first devices 3002 are placed over the substrate 2602 with terminals 3004 over the second conductive structures 2902. The second conductive structures 2902 are over the first conductors 2702 which are over the contact pads 2610.

Figure 31:
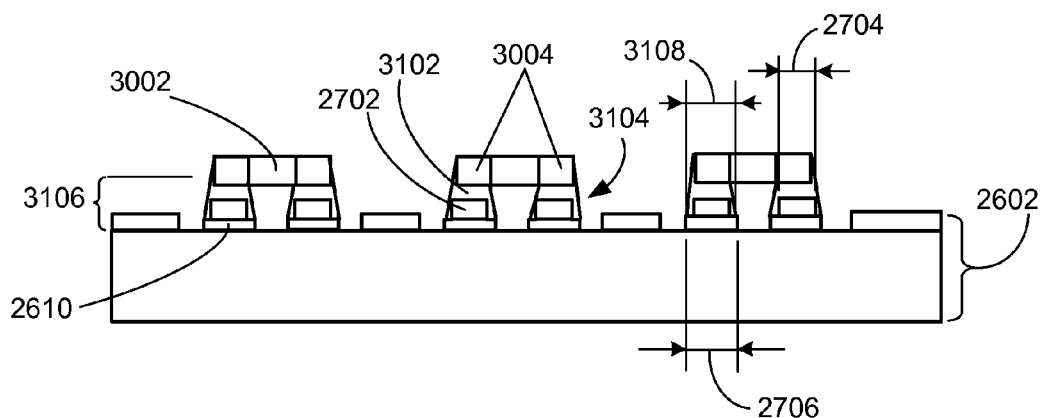
FIG. 31 is the structure of FIG. 30 in forming second conductors.

Referring now to FIG. 31, therein is shown the structure of FIG. 30 in forming second conductors 3102. The second conductive structures 2902 of FIG. 30 undergo a reflow or melting process whereby the second conductive structures 2902 are transformed to the second conductors 3102 over the first conductors 2702. The second conductors 3102 may overhang the first conductors 2702 without contacting the adjacent instance of the second conductors 3102 or the adjacent instance of the first conductors 2702. The second conductors 3102 have a second width 3108, wherein the second width 3108 is greater than or equal to the first width 2704 and less than or equal to the contact width 2706. The second conductors 3102 may also contact the contact pads 2610. The second conductors 3102 form mechanical and electrical connections with the terminals 3004 of the first devices 3002. The first conductors 2702 and the second conductors 3102 form connection structures 3104.

The first conductors 2702 have a higher melting point than the second conductive structures 2902 such that the first conductors 2702 do not melt as the second conductive structures 2902 undergo reflow. The avoidance of the first conductors 2702 melting with the second conductive structures 2902 mitigates and eliminates shorting the first conductors 2702 with the adjacent instance of the first conductors 2702 or with the adjacent instance of the second conductors 3102. Also, avoiding another reflow of the first conductors 2702 does not reduce a clearance 3106 or the space between the first devices 3002 and the substrate 2602.

Figure 32:
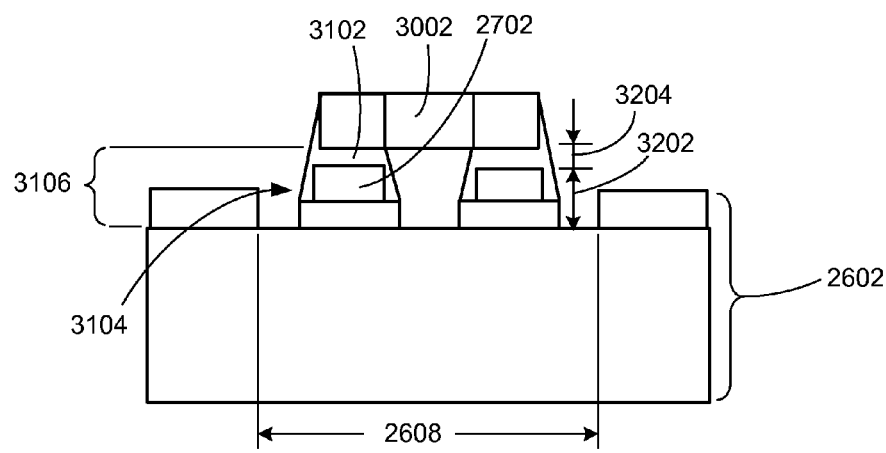
FIG. 32 is a more detailed cross-sectional view of a portion of the structure of FIG. 31.

Referring now to FIG. 32, therein is shown a more detailed cross-sectional view of a portion of the structure of FIG. 31. The more detailed cross-sectional view depicts one of the first devices 3002 connected with the connection structures 3104 and over the substrate 2602.

The first conductors 2702 have a first height 3202 above the substrate 2602 in the mask openings 2608. The second conductors 3102 have a second height 3204 above the first conductors 2702. The clearance 3106 of the first conductors 2702 above the substrate 2602 is the combination of the first height 3202 and the second height 3204. The clearance 3106 provides space for the reliability cleaning process and mold flow for forming the encapsulation 204 of FIG. 2.

Figure 33:
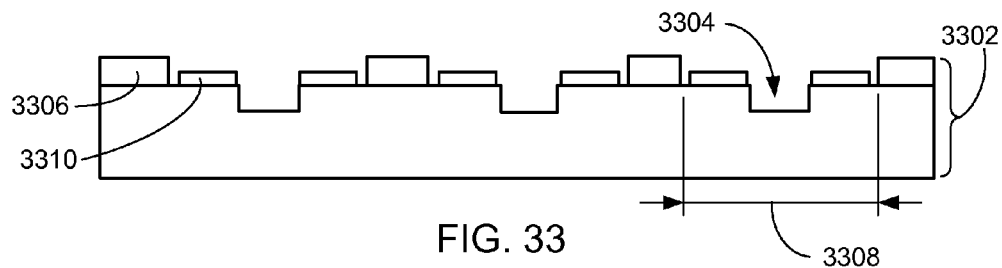
FIG. 33 is a cross-sectional view of a substrate in forming recesses in a fifth embodiment of the present invention.

Referring now to FIG. 33, therein is shown a cross-sectional view of a substrate 3302 in forming recesses 3304 in a fifth embodiment of the present invention. A solder mask 3306 has mask openings 3308. Contact pads 3310 are within the mask openings 3308. The recesses 3304 are formed in the mask openings 3308 between and below the contact pads 3310. The recesses 3304 may be formed by a number of ways. For example, the substrate 3302 may undergo laser drilling, chemical etching, or mechanical notching for forming the recesses 3304.

Figure 34:
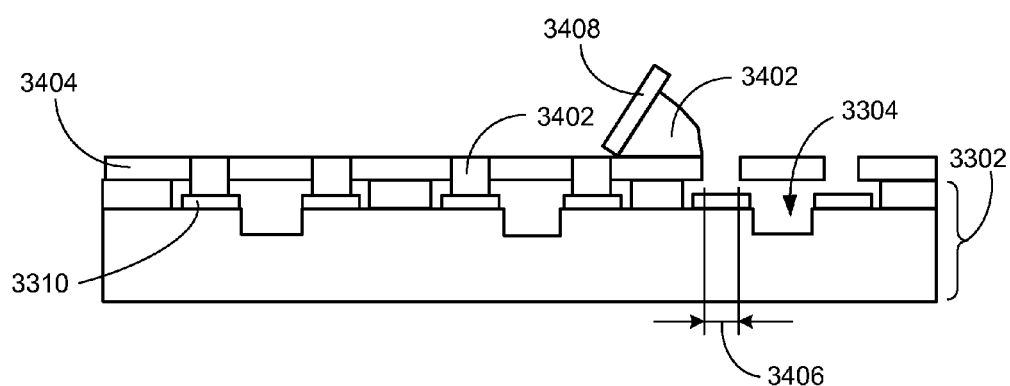
FIG. 34 is the structure of FIG. 33 in applying a conductive material.

Referring now to FIG. 34, therein is shown the structure of FIG. 33 in applying a conductive material 3402. A mask 3404, such as a screen print or stencil, is placed over the contact pads 3310 and the substrate 3302. The mask 3404 has openings 3406 over the contact pads 3310. The conductive material 3402, such as solder paste, is applied over the mask 3404 and fills the openings 3406. The conductive material 3402 preferably contacts the contact pads 3310 without filling the recesses 3304.

The conductive material 3402 may be applied in a number of different ways. For example, an application device 3408, such as a squeegee, may be moved along the exposed surface of the mask 3404. The movement of the application device 3408 spreads the conductive material 3402 along the exposed surface of the mask 3404 filling the openings 3406.

Figure 35:
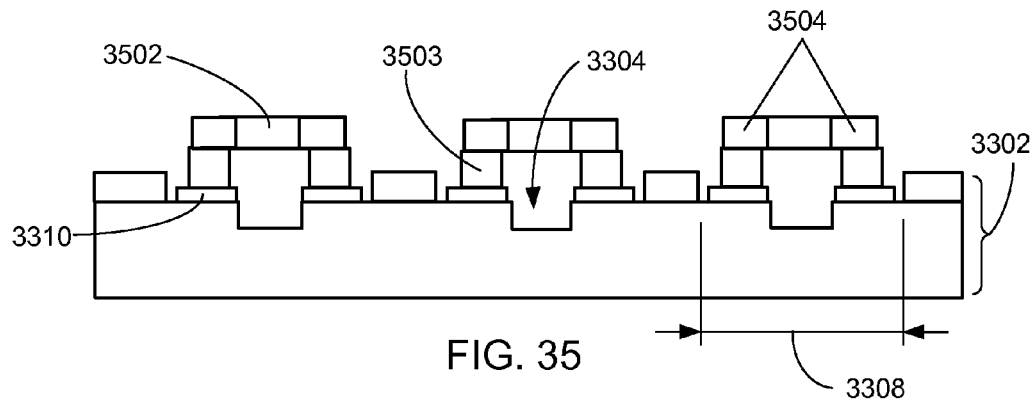
FIG. 35 is the structure of FIG. 34 in mounting the first devices.

Referring now to FIG. 35, therein is shown the structure of FIG. 34 in mounting first devices 3502. The mask 3404 of FIG. 34 is removed leaving conductive structures 3503. The first devices 3502 having terminals 3504 are placed over the substrate 3302. The terminals 3504 are over the conductive structures 3503 and the recesses 3304 in the mask openings 3308. The conductive structures 3503 are over the contact pads 3310.

Figure 36:
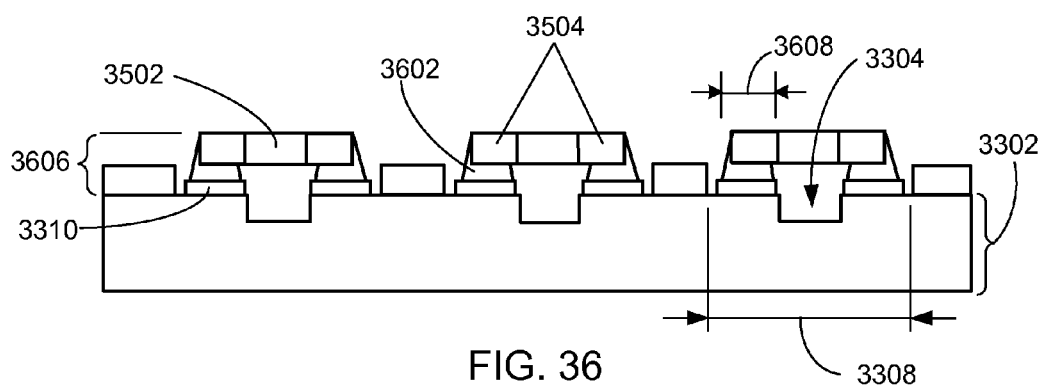
FIG. 36 is the structure of FIG. 35 in forming conductors.

Referring now to FIG. 36, therein is shown the structure of FIG. 35 in forming conductors 3602. The conductive structures 3503 of FIG. 35 undergo a reflow or melting process whereby the conductive structures 3503 are transformed to the conductors 3602 over the contact pads 3310. The conductors 3602 may overhang the contact pads 3310 without contacting the adjacent instance of the conductors 3602. The recesses 3304 serve multiple functions.

For example, the recesses 3304 provide access for solder flux outgassing during solder reflow. Another example, the recesses 3304 provide space for facilitating the cleaning process preventing residue flux or moisture entrapment. Yet another example, the recesses 3304 provide mold flow channels below the first devices 3502 preventing mold void without utilizing mold compound having very fine filler size. The recesses 3304 also provide space for undesired flow of the conductive material 3402 during reflow thereby mitigating or eliminating shorts between the conductors 3602 in the mask openings 3308.

The conductors 3602 form mechanical and electrical connections with the terminals 3504 of the first devices 3502. The conductors 3602 and the recesses 3304 provide a clearance 3606 or the space between the first devices 3502 and the substrate 3302 in the recesses 3304. The conductors 3602 have a width 3608.

Figure 37:
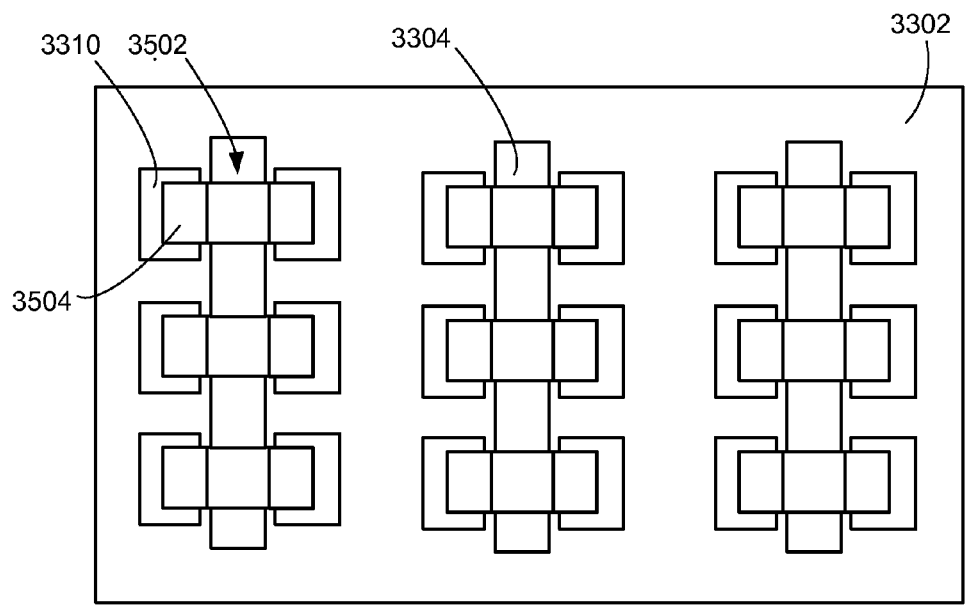
FIG. 37 is a more detailed plan view of the substrate of FIG. 36.

Referring now to FIG. 37, therein is shown a more detailed plan view of the substrate 3302 of FIG. 36. The more detailed plan view depicts the substrate 3302 having the contact pads 3310 therein. The recesses 3304 are preferably between the contact pads 3310. The first devices 3502 are over the recesses 3304 with the terminals 3504 over the contact pads 3310.

Figure 38:
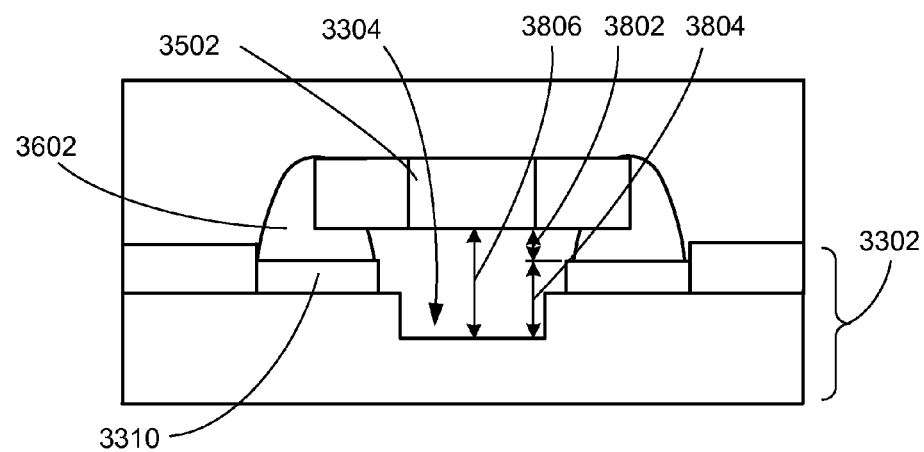
FIG. 38 is a more detailed cross-sectional view of a portion of the structure of FIG. 37.

Referring now to FIG. 38, therein is shown a more detailed cross-sectional view of a portion of the structure of FIG. 37. The more detailed cross-sectional view depicts one of the first devices 3502 connected with the conductors 3602 and over the substrate 3302. The conductors 3602 have a height 3802 to the first devices 3502 above the contact pads 3310. Each of the recesses 3304 has a recess depth 3804 from the bottom the recesses 3304 to the top of the contact pads 3310. A clearance 3806 includes the recess depth 3804 and the height 3802.

Figure 39:
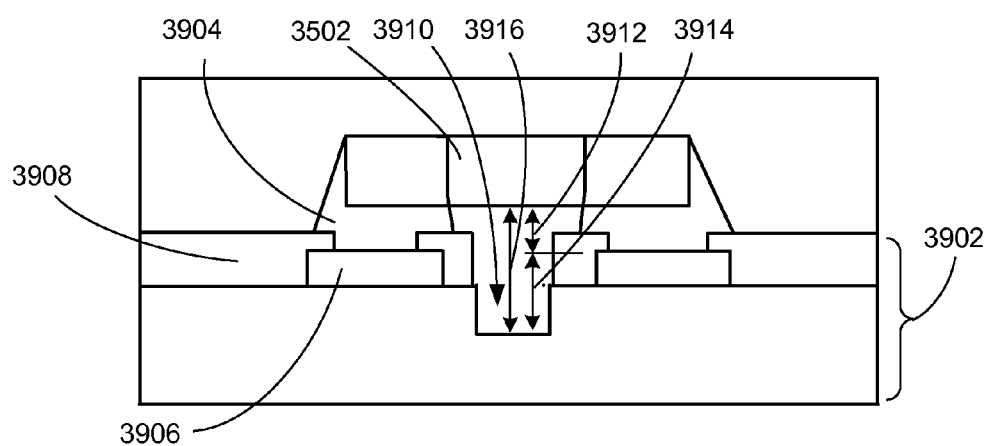
FIG. 39 is a cross-sectional view of a substrate in a sixth embodiment of the present invention.

Referring now to FIG. 39, therein is shown a cross-sectional view of a substrate 3902 in a sixth embodiment of the present invention. The cross-sectional view depicts one of the first devices 3502 connected with conductors 3904 and over the substrate 3902. The conductors 3904 are over contact pads 3906. The contact pads 3906 are within a solder mask 3908. A recess 3910 is preferably under the first devices 3502 and is formed through the solder mask 3908 and the other portion of the substrate 3902 under the solder mask 3908. The conductors 3904 have a height 3912 to the first devices 3502 above the substrate 3902. The recess 3910 has a recess depth 3914 from the bottom the recess 3910 to the top of the solder mask 3908. A clearance 3916 includes the recess depth 3914 and the height 3912.

Figure 40:
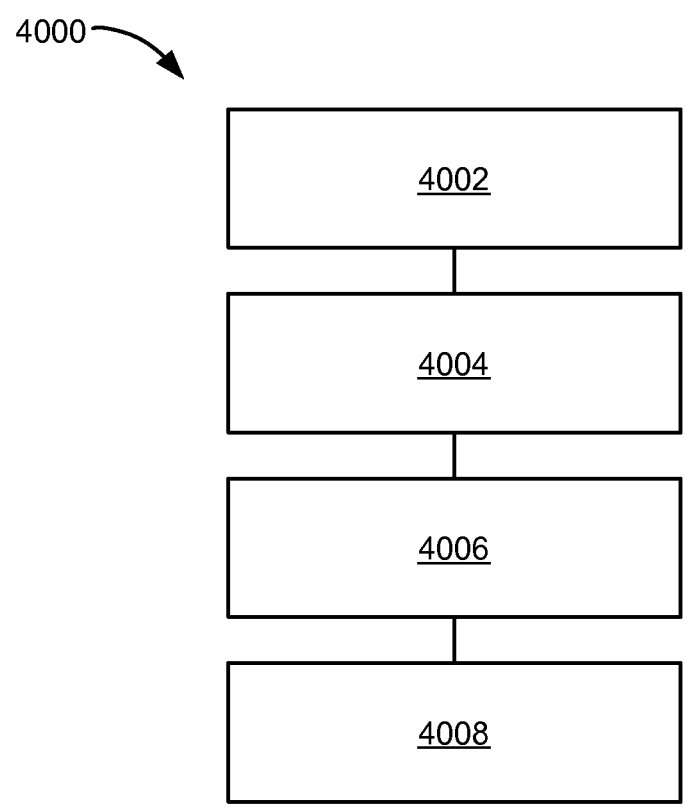
FIG. 40 is a flow chart of an integrated package system for manufacturing the integrated circuit package system in an embodiment of the present invention.

Referring now to FIG. 40, therein is shown a flow chart of an integrated circuit package system 4000 for manufacturing the integrated circuit package system 100 in an embodiment of the present invention. The system 4000 includes providing a substrate having a contact pad in a block 4002; forming a first conductor having a first melting point over the contact pad in a block 4004; forming a second conductor having a second melting point over the first conductor with the first melting point higher than the second melting point in a block 4006; and mounting a first device over the second conductor in a block 4008.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method for manufacturing an integrated circuit package comprising:
    providing a substrate having a contact pad;
    forming a first conductor having a first melting point, a first width, and a first height over the contact pad;
    forming a second conductor having a second melting point, a second width, and a second height over the first height of the first conductor with the first melting point higher than the second melting point and the second width less than or substantially equal to the first width;
    mounting a first device over the second conductor; and
    coupling a second device to a bond pad, in the substrate, adjacent to the contact pad.

2. An integrated circuit package system comprising:
    a substrate having a contact pad;
    a first conductor having a first melting point, a first width, and a first height over the contact pad;
    a second conductor having a second melting point, a second width, and a second height over the first height of the first conductor with the first melting point higher than the second melting and the second width less than or substantially equal to the first width;
    a first device over the second conductor; and
    a second device coupled to a bond pad, in the substrate, adjacent to the contact pad.

3. The system as claimed in claim 2 wherein the first conductor includes gold, copper, aluminum, silver, metal alloy, or solder.

4. The system as claimed in claim 2 wherein the second conductor includes solder.

5. The system as claimed in claim 2 wherein:
    the first device and the substrate have a clearance including the first height and the second height.

* * * * *